(12) United States Patent
Ice et al.

(10) Patent No.: US 7,540,747 B2
(45) Date of Patent: Jun. 2, 2009

(54) MOLDED LEAD FRAME CONNECTOR WITH ONE OR MORE PASSIVE COMPONENTS

(75) Inventors: Donald A. Ice, Milpitas, CA (US); Darin J. Douma, Monrovia, CA (US); Phillip Anthony Kiely, Morgan Hills, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/381,108

(22) Filed: May 1, 2006

(65) Prior Publication Data

US 2006/0249820 A1 Nov. 9, 2006

Related U.S. Application Data

(60) Provisional application No. 60/676,599, filed on Apr. 29, 2005.

(51) Int. Cl.
*H01R 12/00* (2006.01)
(52) U.S. Cl. ............... 439/79; 439/620.06; 439/620.09; 439/620.12; 439/620.13; 439/620.16
(58) Field of Classification Search ............ 439/79, 439/620.06, 630.09, 620.12, 620.13, 620.16, 439/620.09
See application file for complete search history.

(56) References Cited

U.S. PATENT DOCUMENTS

| | | | |
|---|---|---|---|
| 4,471,158 A | | 9/1984 | Roberts |
| 4,593,463 A | | 6/1986 | Kamono |
| 4,689,023 A | | 8/1987 | Strong et al. |
| 5,219,305 A | * | 6/1993 | Kawaguchi et al. .... 439/620.12 |
| 5,286,221 A | * | 2/1994 | Fencl et al. .................. 439/607 |
| 5,295,214 A | | 3/1994 | Card et al. |
| 5,340,334 A | * | 8/1994 | Nguyen .................. 439/620.12 |
| 5,613,880 A | * | 3/1997 | Wang ..................... 439/620.03 |
| 5,619,794 A | | 4/1997 | Hokazono |
| 5,632,630 A | | 5/1997 | Card et al. |
| 5,663,526 A | | 9/1997 | Card et al. |
| 5,742,480 A | | 4/1998 | Sawada et al. |
| 5,768,777 A | | 6/1998 | Lemke |
| 5,802,711 A | | 9/1998 | Card et al. |
| 6,068,523 A | | 5/2000 | Takahashi |

(Continued)

OTHER PUBLICATIONS

Office Action mailed Mar. 8, 2005 for U.S. Appl. No. 10/809,992.

(Continued)

*Primary Examiner*—Tho D Ta
(74) *Attorney, Agent, or Firm*—Workman Nydegger

(57) ABSTRACT

Exemplary embodiments of the present invention illustrate lead frame connectors for connecting optical sub-assemblies to printed circuit boards in optical transceiver modules. The lead frame connectors include a conductive lead structure that is encased in a plurality of polymer casings. The polymer casings provide electrical insulation for the conductors in the lead frame as well as mechanical support for the finished component. One or more passive components can mount to the conductors of the lead frame connector to aid with impedance matching between an optical sub-assembly, the lead frame connector, and the printed circuit board. The lead frame connectors connect to the leads associated with the optical sub-assemblies and are surface mounted onto the printed circuit board to establish connectivity between the optical sub-assembly and the printed circuit board.

7 Claims, 3 Drawing Sheets

U.S. PATENT DOCUMENTS

| | | | |
|---|---|---|---|
| 6,086,413 | A | 7/2000 | Karasik et al. |
| 6,125,535 | A | 10/2000 | Chiou et al. |
| 6,368,158 | B1 | 4/2002 | Kan |
| 6,454,618 | B1 | 9/2002 | Andoh et al. |
| 6,488,534 | B2 | 12/2002 | Soga et al. |
| 6,527,571 | B2 | 3/2003 | Muta et al. |
| 6,588,100 | B2 | 7/2003 | Ma et al. |
| 6,617,518 | B2 | 9/2003 | Ames et al. |
| 6,652,294 | B1 | 11/2003 | Zhang |
| 6,688,897 | B2 | 2/2004 | Korsunsky et al. |
| 6,762,119 | B2 | 7/2004 | Ray et al. |
| 6,764,336 | B2 | 7/2004 | Ma et al. |
| 6,764,338 | B2 | 7/2004 | Fang |
| 6,796,852 | B2 | 9/2004 | Okamoto |
| 6,817,782 | B2 | 11/2004 | Togami et al. |
| 6,922,231 | B1 | 7/2005 | Wang et al. |
| 6,966,800 | B2 | 11/2005 | Mott |
| 6,976,854 | B2 | 12/2005 | Stockhaus et al. |
| 7,097,468 | B2 * | 8/2006 | Ice ............... 439/79 |
| 7,144,259 | B2 * | 12/2006 | Ice et al. ......... 439/79 |
| 7,229,295 | B2 * | 6/2007 | Ice et al. ......... 439/79 |
| 7,258,264 | B2 | 8/2007 | Ice |
| 7,311,530 | B2 | 12/2007 | Ice et al. |
| 7,370,414 | B2 | 5/2008 | Ice |
| 2002/0196996 | A1 | 12/2002 | Ray |
| 2003/0026081 | A1 | 2/2003 | Liu et al. |
| 2003/0085054 | A1 | 5/2003 | Ames |
| 2003/0180012 | A1 | 9/2003 | Deane |
| 2005/0142685 | A1 | 6/2005 | Ouellet |
| 2005/0154618 | A1 | 7/2005 | Kita |
| 2005/0162761 | A1 | 7/2005 | Hargis |
| 2005/0188535 | A1 | 9/2005 | Ice |
| 2005/0191879 | A1 | 9/2005 | Ice |
| 2005/0221637 | A1 | 10/2005 | Ice et al. |
| 2005/0232641 | A1 | 10/2005 | Ice et al. |
| 2006/0118807 | A1 | 6/2006 | Ives et al. |
| 2006/0140554 | A1 | 6/2006 | Oki |
| 2006/0252313 | A1 | 11/2006 | Ice |
| 2006/0263013 | A1 | 11/2006 | Sone |

OTHER PUBLICATIONS

Office Action mailed Feb. 14, 2006 for U.S. Appl. No. 11/236,123.
Notice of Allowance mailed Feb. 12, 2007 for U.S. Appl. No. 11/468,752.
U.S. Appl. No. 10/810,040, filed Mar. 26, 2004, Ice.
U.S. Appl. No. 11/066,030, filed Feb. 25, 2005, Ice.
U.S. Appl. No. 11/426,298, filed Jun. 23, 2006, Ice et al.
U.S. Appl. No. 10/809,992, mailed Sep. 23, 2005, Notice of Allowance.
U.S. Appl. No. 10/809,992, mailed Apr. 14, 2006, Notice of Allowance.
U.S. Appl. No. 10/809,992, mailed Jul. 21, 2006, Notice of Allowance.
U.S. Appl. No. 11/236,123, mailed Jul. 31, 2006, Notice of Allowance.
U.S. Appl. No. 11/066,079, mailed Jan. 24, 2006, Office Action.
U.S. Appl. No. 11/066,079, mailed May 9, 2006, Office Action.
U.S. Appl. No. 11/066,079, mailed Dec. 6, 2006, Office Action.
U.S. Appl. No. 11/066,079, mailed Aug. 10, 2007, Notice of Allowance.
U.S. Appl. No. 10/810,040, mailed Aug. 17, 2005, Office Action.
U.S. Appl. No. 10/810,040, mailed Apr. 10, 2005, Office Action.
U.S. Appl. No. 10/810,040, mailed Oct. 24, 2006, Office Action.
U.S. Appl. No. 10/810,040, mailed Jun. 21, 2007, Office Action.
U.S. Appl. No. 10/810,040, mailed Feb. 19, 2008, Office Action.
U.S. Appl. No. 10/810,040, mailed Jul. 15, 2008, Notice of Allowance.
U.S. Appl. No. 11/066,056, mailed May 22, 2006, Office Action.
U.S. Appl. No. 11/066,056, mailed Nov. 22, 2006, Office Action.
U.S. Appl. No. 11/066,056, mailed Apr. 17, 2008, Notice of Allowance.
U.S. Appl. No. 10/810,041, mailed Nov. 9, 2006, Office Action.
U.S. Appl. No. 10/810,041, mailed Jun. 21, 2007, Office Action.
U.S. Appl. No. 10/810,041, mailed Jan. 9, 2008, Notice of Allowance.
U.S. Appl. No. 11/066,030, mailed Sep. 25, 2007, Office Action.
U.S. Appl. No. 11/066,030, mailed May 28, 2008, Office Action.

* cited by examiner

MOLDED LEAD FRAME CONNECTOR WITH ONE OR MORE PASSIVE COMPONENTS

CROSS-REFERENCE TO RELATED APPLICATIONS

This application claims the benefit of the U.S. Provisional Patent Application No. 60/676,599, filed Apr. 29, 2005, and entitled "Molded Lead Frame Connector with One or More Passive Components," which is incorporated herein by reference in its entirety.

BACKGROUND OF THE INVENTION

1. The Field of the Invention

The present invention relates generally to optical transceiver modules. More specifically, the present invention relates to molded lead frame connectors used to connect an optical sub-assembly to a printed circuit board in an optical transceiver module.

2. Background and Relevant Art

Optical transceivers are used to transmit and receive optical signals from an optical network and to enable electrical network components to interface with and communicate over optical networks. Many optical transceivers are modular and are designed in accordance with industry standards that define mechanical aspects of the transceivers, form factors, optical and electrical requirements, and other characteristics and requirements of the transceivers. For example the Small Form-Factor Module Multi-Source Agreement (SFF MSA), the Small Form-Factor Pluggable Module Multi-Source Agreement (SFP MSA) and the 10 Gigabit Small Form Factor Pluggable Module Multi-Source Agreement (XFP MSA) Revision 3.1 define such standards.

The basic optical components of conventional transceivers include a transmitter optical sub-assembly (TOSA) and a receiver optical sub-assembly (ROSA). The TOSA receives electrical signals from a host device via circuitry of the transceiver module and generates a corresponding optical signal that is then transmitted to a remote node in an optical network. Conversely, the ROSA receives an incoming optical signal and outputs a corresponding electrical signal that can then be used or processed by the host device. Additionally, most transceivers include a rigid printed circuit board (PCB) containing, among other things, control circuitry for the TOSA and ROSA.

The connections between the optical sub-assemblies and the PCB in the transceiver module have various electrical and mechanical requirements. For instance, it is desirable to match the impedances of the TOSA, ROSA, and/or the PCB to reduce and/or eliminate signal reflection and losses. One of the most common electrical connection components used in conventional optical transceiver modules is a flexible printed circuit board, or "flex circuit," that connects the rigid printed circuit board to leads associated with the TOSA or ROSA. Flex circuits have several advantages, including good electrical performance and radio frequency response. Advantageously, the flex circuits also have the ability to take up tolerances in the modules and to withstand stresses that arise during manufacture and operation of the modules.

While flex circuits have been widely used in recent years in optical transceiver modules, flex circuits represent a significant portion of the costs and labor required to manufacture transceiver modules. As the price of transceiver modules drops, the costs associated with flex circuits continue to represent an increasing proportion of the overall costs of transceiver modules. Due to the nature of flex circuits, the costs of producing flex circuits are generally higher than the cost of a PCB that performs the same functions.

Other approaches to connecting optical sub-assemblies to printed circuit boards have been introduced in recent years. For example, the leads protruding from TOSAs and ROSAs can be bent into a configuration that enables the leads to be directly soldered or otherwise connected to the printed circuit board. This technique is often less expensive than the use of flex circuits, but can lead to unfavorable radio frequency (RF) response due to the inability to carefully control impedances. In addition, bending the leads of TOSAs and ROSAs introduces reliability risks due to the likelihood of damaging glass seals or other fragile portions of the header assemblies in TOSAs and ROSAs that enclose the lasers and photodetectors, respectively.

Because of the possibility of damaging the TOSAs and ROSAs and poor electrical performance, bending the leads of the TOSAs and ROSAs to enable them to be directly connected to the printed circuit board is not suitable for many transceiver modules. This approach is particularly unsuitable for relatively high-speed transceiver modules, in which the RF response of the conductors is more important.

In addition with general problems associated with connecting the OSAs and PCB, it is also necessary for the structure connecting the OSA and the PCB to impedance match with the OSA and the PCB. Although it is possible to design the OSA, connector, such as the flex circuit, and the PCB in their respective interfaces, sometimes it is necessary to operate the OSA at a different signal rate. With the frequency of the signal being related to impedances, changes in the OSA operating frequency result in changes to the matched impedances. This can degrade the signal because unmatched impedances result in signal reflections and signal losses. It is difficult for existing technologies to accommodate for changes in OSA usage without redesigning the OSA, PCB and the flex circuit, which is costly and time consuming.

BRIEF SUMMARY OF THE EMBODIMENTS

Embodiments of the present invention relate to lead frame connectors that are used to electrically and mechanically connect optical sub-assemblies (OSAs) to printed circuit boards in optical transceiver modules. The lead frame connectors enable optical sub-assemblies to be connected to the printed circuit board in optical transceiver modules in a reliable and inexpensive manner, while maintaining desired radio frequency (RF) responses of the modules. The use of such lead frame connectors eliminates the need for flexible printed circuit boards that have been used in conventional transceiver modules. The lead frame connector eliminates the problems associated with signal reflection caused by unmatched impedances with the connection between the OSA and the printed circuit board.

According to one embodiment, the lead frame connector includes a conductive structure that can be encased within a casing. The casing provides electrical insulation for the conductors in the lead frame as well as mechanical support for the finished component. In one embodiment, the casing can be an insert injection molded plastic casing. One or more passive components mount to the conductors of the lead frame connector to aid with matching the impedance of the conductors with the OSA and printed circuit board. The lead frame connectors connect to the leads associated with the optical sub-assemblies. The lead frame connectors also can be surface mounted onto the printed circuit board to establish connectivity between the optical sub-assembly and the printed circuit board. The lead frame connectors can be adapted for use with transmitter optical sub-assemblies and receiver optical sub-assemblies, and can have any number of leads.

An alternate embodiment of the present invention includes a conductive structure that can be encased within two casings. The conductive structure and two casings can be coplanar during the molding process. This makes the creation of the tooling needed to produce the lead frame connectors much easier than prior designs. In one embodiment, the casings can be insert injection molded plastic casings. The casings provide electrical insulation for the conductors in the lead frame as well as mechanical support for the finished component. One or more passive components mount to the conductors of the lead frame connectors to aid with matching the impedance of the conductors with the OSA and printed circuit board. The conductive lead structure of the lead frame connector connects to the leads associated with the optical sub-assemblies. In this embodiment, the two casings allow the conductive leads to be bent after the molding process. This facilitates easy surface mounting onto the printed circuit board to establish connectivity between the optical sub-assembly and the printed circuit board.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE EMBODIMENTS

The present invention relates to lead frame connectors that are used to electrically and mechanically connect optical sub-assemblies to printed circuit boards in optical transceiver modules. The lead frame connector can include a plurality of conductors disposed with a molded casing, such as a one-piece or multi-piece casing or housing. Molding of the casing or housing about the conductors can optionally occur as the conductors lie in a single plane, thus making it easier to fabricate the lead frame connectors. Disposed within the casing or housing and mounted to one or more of the conductors are one or more passive components, such as but not limited to, resistors, capacitors, and inductors, that aid in terminating the conductors and prevent signal reflection at the end of the conductors and between the optical sub-assembly and the printed circuit board.

The lead frame connectors of the present invention provide several advantages compared to the use of flex circuits or other conventional techniques. Compared to flex circuits, the components of the lead frame connector are significantly less expensive. In addition, the process of manufacturing a transceiver module using lead frame connectors can require less labor through increased automation. Compared to simply bending the leads of the optical sub-assemblies to permit direct connection to a PCB, the lead frame connectors have significantly better electrical performance and RF response. Moreover, there can be no significant risk of damaging the fragile portions of the optical sub-assemblies during the process of connecting the optical sub-assemblies to the printed circuit board. Additionally, inclusion of the passive components within the electrical path of signals propagating along the lead frame connectors aids in terminating the signal path and limits signal reflection at the optical sub-assembly and the printed circuit board. Further, inclusion of the passive components allows OSAs to be operated at various different data rates accommodating for changes in impedance in a simple manner.

Figure 1:
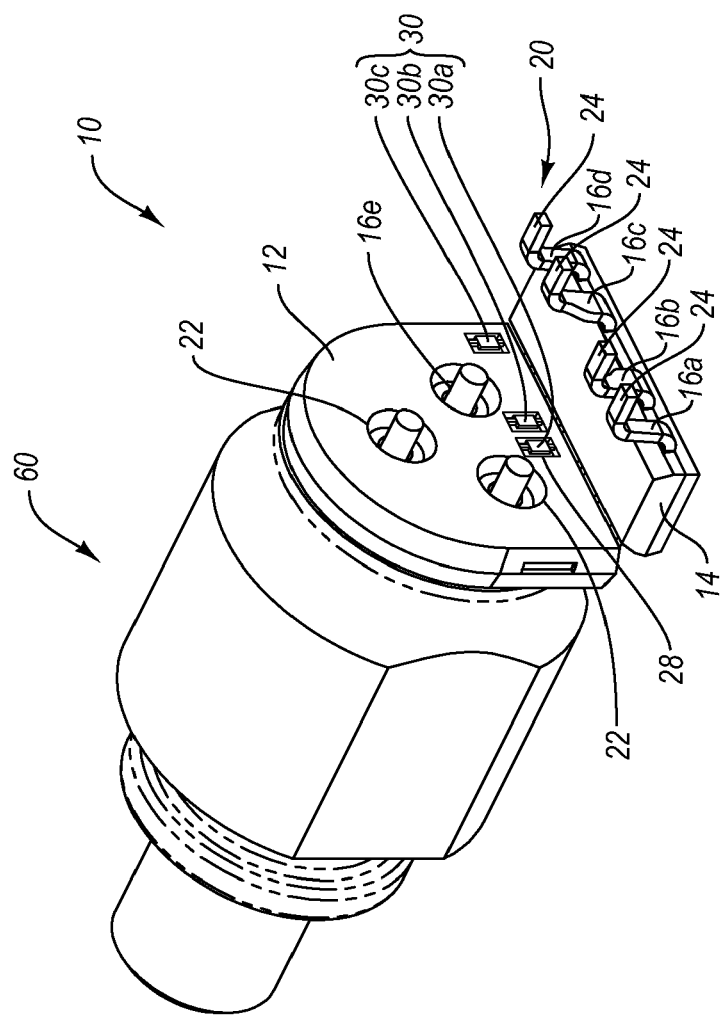
FIG. 1 illustrates a perspective view of a lead frame connector that is constructed according to one exemplary embodiment the present invention.

FIG. 1 illustrates one exemplary configuration of a lead frame connector 10 according to the present invention. As shown, lead frame connector 10 is mounted to an optical sub-assembly, such as a TOSA 60. Another configuration of the lead frame connector 10 can also mount to a ROSA, such as ROSA 110 illustrated in FIGS. 5 and 6. As shown in FIG. 1, the lead frame connector 10 can include a first casing 12 and a second casing 14. Collectively, the first casing 12 and the second casing 14 form the housing of the lead frame connector 10.

The first casing 12 and the second casing 14 can each support a portion of one or more conductors 16a-16e that can transmit high frequency signals, lower frequency signals, and biasing current to the TOSA 60. For instance, conductor 16a can be used to transmit a low frequency signal, conductors 16b and 16c can be used to transmit a high frequency signal, and conductor 16d can be used to transmit low frequency signals and/or the biasing current used to operate the TOSA 60.

Mounted to one or more of the conductors 16a-16e and received with one or more recesses 28 of housing are one or more passive components 30. In this illustrated configuration, the passive components 30 can be a resistor 30a, a capacitor 30b, and an inductor 30c. These passive components 30 terminate conductors 16b-16c and limit and control signal reflection between the optical sub-assembly and the printed circuit board, which will be discussed in more detail hereinafter. For instance, to terminate the conductors 16b-16c, the impedance presented by the TOSA 60 should match the impedance presented by the conductors 16b and 16c, i.e., the differential impedance of the conductors 16b and 16c. The impedance presented by the conductors 16b and 16c can be varied by changing the resistance of the resistor 30a.

In the illustrated configuration, the resistor 30a can be used to terminate the conductors 16a-16c. If we assume that the differential impedance presented by the conductors 16b and 16c is 50 ohms, then to terminate the conductors 16b and 16c a 50 ohms resistance is to be placed across the conductors 16b and 16c. With the TOSA 60 providing certain resistance, such as 10 ohms, the resistor 30a can provide the remaining 40 ohms of resistance.

Turning to the capacitor 30b and the inductor 30c, these components can be used to control the overall inductance and capacitance presented by the lead frame connector 10. In the illustrated configuration, the biasing current can be transmitted along conductor 16d and through inductor 30c. The inductor 30c can prevent high frequency signals being transmitted along the conductor 16d, while allowing the biasing current to be transmitted to the TOSA 60. To adjust or compensate for any excessive inductance, the capacitor 30b can be optionally included. Similarly, the value of the inductance can be varied to adjust or compensate for any excessive capacitance.

Although reference is made to a resistor, a capacitor, and an inductor, it can be understood that structures other than a resistor, a capacitor, and an inductor can be used. For instance, instead of inductor 30c, a ferrite material may be used to provide the desired inductance upon one of the conductors 16-16e.

As illustrated, a first end of each conductor 16a-16d is contained within the first casing 12, the first end of conductors 16a and 16b having contacts 22 that can cooperate with the leads of an optical subassembly, such as a TOSA 60. The conductor 16e also includes a contact 22 that can cooperate with the lead of the TOSA 60. The electrical contacts 22 are fixed in position relative to one another by the first casing 12, however, it can be understood that the electrical contacts 22 can be held in a fixed position by first casing 12 without being entirely contained therein. Optionally, these contacts 22 are separate from the conductors 16a-16e, but being electrically connected to the conductors 16a-16e, i.e., RF signals can pass from one or more of the conductors 16a-16e to one or more of the contacts 22. For instance, conductors 16c and 16d can be separated from the contact 22 associated with the conductor 16e, but electrically connected to the contact 22 through the passive components 30.

Figure 5:
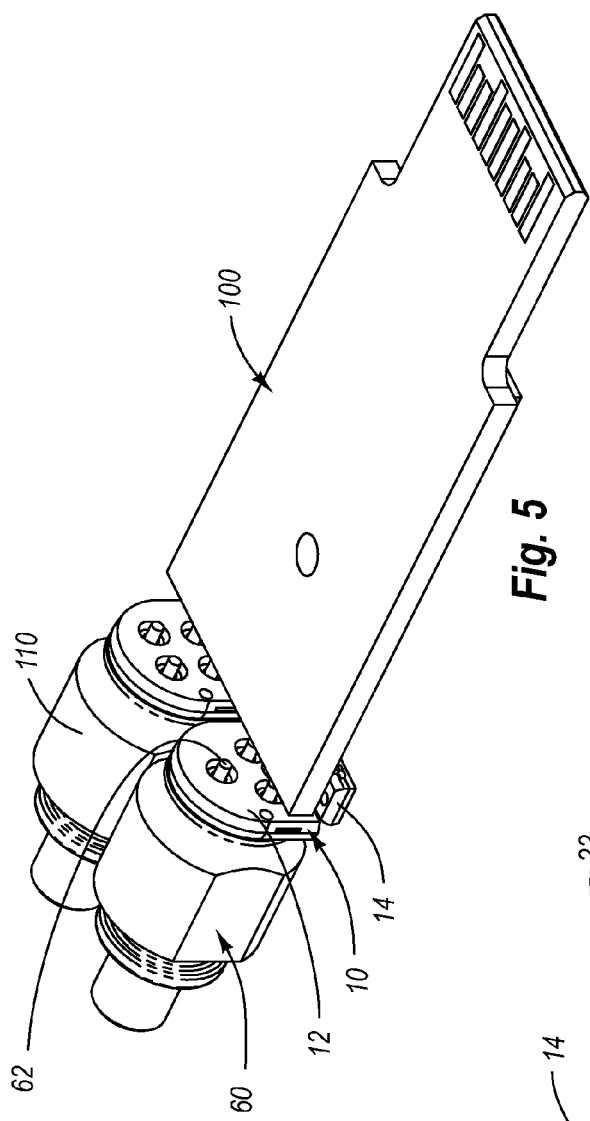
FIG. 5 is a perspective view of one side of a printed circuit board that has the lead frame connector of FIGS. 1-3 attached thereto.

A second end 20 of each conductor 16a-16d can include a contact 24 that can be used to attach and make electrical contact with a printed circuit board, such as printed circuit board 100 of FIG. 5. Stated another way, and shown in FIG. 1, each second end 20 can act or function as a contact or point that is sized and configured to be connected to, for example, the printed circuit board 100 (FIG. 5). As shown, the second end 20 of each conductor 16a-16d has a generally bent configuration to facilitate efficient and easy attachment to the printed circuit board 100 (FIG. 5). It will be understood however, that other configurations of the second end 20 are possible.

One advantage of this configuration of the lead frame connector 10 is that the first casing 12 and the second casing 14 can be coplanar during the manufacturing process. The two casings 12, 14 and the conductors 16a-16e can be generally aligned in parallel planes, optionally co-planar, during the manufacturing process, and the second casing 14 orientated relative to the first casing 12 during the assembly process, such as before or after attachment of the lead frame connector 10 to an optical subassembly, such as TOSA 60 and ROSA 110 (FIG. 5). In either case, each conductor 16a-16d can then be manipulated or bent to the desired configuration at a location between the first casing 12 and the second casing 14 and/or at a location adjacent to the second casing 14, as part of the assembly process. Of course, depending on the position of the optical sub-assemblies and the printed circuit board 100 (FIG. 5) in any particular optical transceiver module, the conductors 16a-16d can be bent in any necessary orientation.

Although the illustrated lead frame connector 10 includes four conductors and three electrical contacts for connecting to an optical sub-assembly, such as the TOSA 60 it can be appreciated that other lead frame connectors can include more or less conductors and electrical contacts. For instance, when an optical sub-assembly includes four leads, the lead frame connector can include four or more electrical contacts and four or more conductors. Similarly, when an optical sub-assembly includes six leads, the lead frame connector can include six or more electrical contacts and six or more conductors.

In exemplary embodiments, the first and second casings 12, 14 of the lead frame connector 10 can be fabricated using an injection molding process, a transfer molding process, or other molding processes known to those of skill in the art. The casings 12, 14 can generally be made from a polymer including, but not limited to, thermoplastics and thermoset material, synthetic materials, or other material capable of functioning as a dielectric or insulator. With respect to use of polymers, any polymer that has sufficient mechanical strength to withstand the bending process can be used. Various types of plastics, such as, but not limited to, a Liquid Crystal Polymer (LCP) and Polyetherimide (PEI). One example of an LCP is Vectra® manufactured by Ticona Engineering Polymers. One example of a PEI is Ultem® PEI resin from General Electric (GE) Plastics.

In some embodiments, it can be desirable to use a material having a minimum of an Underwriter's Laboratories (UL) 94V0 flammability rating. In yet other embodiments, it can be desirable to utilize materials that meet the Reduction of Hazardous Substances (ROHS) Directive 2002/95/EC of the European Union, which is incorporated herein by reference in its entirety. Among other things, the ROHS Directive eliminates the use of halogenic fire retardants and the use of several heavy metals, such as lead and cadmium, in order to preserve the environment. The LCP material discussed above exhibits both of these desirable properties.

The lead frame connector 10 of FIG. 1 yields desirable electrical performance and RF responses. These results can be achieved because of the ability to control impedances associated with the lead frame connector by varying the dimensions of the conductors and/or inclusion of one or more passive components 30 to terminate the conductors 16a-16e. Since the electrical performance of the lead frame connector 10 is particularly important for relatively high speed transceiver modules, such as those that operate at 1, 2, 4, or as much as 10 Gbit/s or higher, the width and shape of the conductors 16a-16e, the gaps between conductors 16a-16e, and the values of the passive components 30 can be carefully controlled to obtain the desired impedances and signal transmission characteristics. For instance, the lead frame connector 10 for use with a TOSA can be designed to utilize 25 ohm single end impedance or 50 ohm differential impedance. Alternately, a lead frame connector for use with a ROSA can be designed to utilize a 50 ohm single end impedance, or a 100 ohm differential impedance. Differential signals that propagate along the two adjacent conductors, such as the high speed conductors, are 180° out of phase. Since the signals are transmitted along proximate paths, the phase shift helps to mitigate or even eliminate the potential cross talk and interference between the signals.

The impedances can be controlled by adjusting the shape, position, and dimensions of each conductor 16a-16e in the lead frame connector 10, based on the electrical and RF conditions that are to be experienced in any particular application. In addition, conductor impedances can be controlled by including one or more passive components 30 to terminate the conductors 16*a*-16*e*. Prior to manufacturing the lead frame connector 10, computer simulations of various designs can be performed to identify which lead frame connector design generates the desired and acceptable RF responses, i.e., provides the above mentioned impedances. Various factors can be taken into account during the computer simulations. These factors can sometimes be broken down into factors that mostly affect the physical design and factors that mostly affect the electrical design. Physical design factors can include the layout of the lead frame connector, how the connector connects to both the OSA and the printed circuit board, how well the end product stands up to normal handling, and dielectric constant of the material forming the casings 12 and 14. It is also possible that the plastic material used to mold the lead frame connector 10 can be selected to have a dielectric constant selected to aid with obtain the desired impedances.

Turning to electrical design factors, these can include selecting material for the leads, determining the exact dimensions of the leads based on a desired frequency range in which the finished assembly will operate, determining the size and spacing of the circuits on the PCB, the number and location of the passive components 30, etc to obtain the desired impedances. For instance, since the conductors 16*a*-16*e* can optionally function as transmission lines, dependent upon the operating speed of the OSA, it is desirable to terminate each conductor 16*a*-16*e* to prevent signal reflection.

In accordance with one embodiment, the physical and electrical design factors can be used to design the connectors of the lead frame connector and achieve the desired impedance characteristics. In one stage, an initial lead frame connector design can be configured. This stage can be performed manually, by computer-aided design, or by other suitable method, and serves as a starting point for the lead frame connector design. Often, the initial lead frame connector design is based on what is most readily manufacturable.

In a next stage, the structure of the initial lead frame connector design can be simulated, or modeled, in a computing environment, such as an environment using one or more computer executable applications, such as commercial or private software applications. In one embodiment, the structural details of the initial connector design can be input into a computing device, such as a desktop computer, using a three dimensional ("3-D") structural modeling application, such as SOLIDWORKS, thereby creating a computerized model of the initial connector design. In this way, the various components of the connector, including the conductors, the first and second casings, etc., can be separately defined in the computing environment.

In a next stage, desired characteristics can be assigned to the modeled initial lead frame connector design. In one embodiment, this can be accomplished by importing the computerized model from the 3-D modeling application, such as SOLID WORKS, to a simulation application, such as HFSS, an acronym for "high frequency structure simulator," which is a 3-D EM field solver product produced by Ansoft Corporation. Although this is one simulation application, one skilled in the art will understand that various other applications can be used to simulate the proposed configuration.

In one embodiment, a common file type can be used to enable file transfer between the 3-D structuring and simulation applications. For example, ACIS files having a ".sat" file extension can be used in one embodiment in exporting computer-modeled lead frame connector designs from SOLID WORKS to HFSS. In addition to this, however, various other file formats can also be used in performing the stages described herein.

Once the initial connector design is imported into to the simulation application, the various components included in the lead frame connector can be assigned electrical characteristics. This can include assigning dielectric values to the insulating portions of the lead frame connector, such as the first and second casings, and conductivity values to the conductors, according to material composition. This stage can also include the definition of the various ports by which electrical signals enter and exit the lead frame connector, such as the first and second ends of the conductors. In one embodiment, it is appreciated that the stages of structural simulation of the lead frame connector simulation and characteristic assignment of the lead frame connector components can be performed as a single stage in connection with a single software application or other suitable computer executable application. Also, the characteristic assignment stage above can further include defining boundary conditions at the input and output ports of the lead frame connector.

The above stages can further include simplifying the computer-modeled lead frame connector structure to provide suitable simulation results while preserving resources, such as time, computing power, etc.

In a next stage, a set of parameters for a simulation can be defined, and a simulation run to determine whether the desired parameters are met within acceptable, predefined ranges. In one embodiment, for instance, the reflection, or return loss, of an electrical signal can be measured for the conductors of a lead frame connector having specified thickness and spacing, as initially designed in the above stages. Thus, an acceptable range for the predefined parameter of return loss versus conductor spacing, thickness, etc., can be defined. The simulation can then be performed, simulating the passage of signal having a predetermined frequency, typically a high frequency signal in the gigahertz range, through the initial connector design configured as just described. The simulation software can then produce the results, which can be viewed in a number of acceptable ways, including graphs, charts, and diagrams.

Should the results of the simulation fall within the range of the parameter, no further modeling need be performed with respect to the defined parameter. Should the simulation results not be satisfactory, however, the initial lead frame connector design can be modified and the simulation re-run. Modification of the initial lead frame connector design can involve one or more of the stages described above. In the case where the computer modeling and simulation stages are performed by a single application, for instance, redesign of needed portions of the lead frame connector design can be performed without having to import the redesign from another application. Iterations of the method are possible until acceptable ranges are encountered for all specified portions of the lead frame connector transmission paths with regard to the targeted parameter, at which point no further design changes are required. In light of these results, it should also be considered whether the final lead frame connector design conforms to manufacturability standards. If not, further design changes can be made to enable the lead frame connector to be produced as part of a manufacturing process.

Using the processes described above, it can be determined that the leads in both lead frame connector 10 can have a thickness of approximately 0.2 mm, a width of approximately 0.5 mm, and a separation distance of approximately 0.3 mm. Depending on the materials used for the leads and the casing, and further depending on the specific frequency that the lead frame/optical sub-assembly combination is designed for, different dimensions are also possible and fall within the scope of the embodiments discussed herein. The dimensions cited above are provided strictly as an example of one possible set of dimensions for the leads. Similarly, in one configuration, the resistor 30a can be about a 40 ohm resistor, the capacitor 30b can be a 0.1 pico-farad capacitor, and the inductor 30c can be a 0.1 micro Henries inductor. The cited passive components are provided strictly as exemplary of possible values with it being understood that the passive components can have values larger or smaller than the above. Additional information regarding the passive components will be provided herein after with respect to the methods and processes for fabricating or manufacturing the lead frame connector 10.

In keeping with the ROHS standard mentioned above, some particular materials can be selected and tested to ensure acceptable electrical and RF performance for the lead frame connectors, and for the modules as a whole. In one embodiment, the leads can be made from a copper-iron alloy (C194-Spring Hard) which is commonly used in semiconductor package lead frames. This material can be selected for, among other things, its excellent mechanical properties and platability. For example, the material can be sufficiently flexible to allow for the thermal expansion and contraction that occurs within a module without affecting the electrical properties of the lead frame. Additionally, this flexibility allows for the mechanical connection of the lead frames to the optical subassemblies and PCB without inducing unwanted stress in the components. By making the pads on the PCB somewhat larger than the actual leads to be connected, the physical placement of the leads on the PCB can be adjusted to allow for mechanical alignment of the OSA, the lead frame and the PCB without sacrificing electrical performance. Those skilled in the art will realize that a wide variety of other metals and/or metal alloys can also be used in the lead frames of the present invention.

In one embodiment, the conductors can be plated with successive layers of nickel, palladium, and gold prior to undergoing the plastic molding process. This plating system has excellent solderability and can be selected because it is lead free (a ROHS requirement) and does not exhibit the tin whisker problems associated with pure tin plating systems. Other plating materials can also be used.

Additional details of the lead frame connector 10 of the present invention will be provided hereinafter in the discussion of the processes and methods of manufacturing or fabricating the lead frame connector 10 and mounting the lead frame connector 10 to an optical subassembly and/or a printed circuit board. One of the advantages of the exemplary embodiments of the lead frame connectors of the present invention is that they can be manufactured at a much lower cost than conventional flex circuits that have been used in optical transceiver modules.

According to one embodiment, one exemplary method of manufacturing the lead frame connector 10 can be performed using a reel-to-reel insert injection molding process. Reel-to-reel insert injection molding processes are known generally in the art, but have not previously been applied to the manufacture of connectors that can be used to connect optical subassemblies to printed circuit boards of optical transceiver modules.

This exemplary process of manufacturing lead frame connector 10 can include stamping the conductor structure and configuration in a ribbon of conductive material, such as copper, steel, or other conductive material. Although stamping is one manner of forming the. lead frame conductors, such as when a high volume of conductors are need, other techniques can be used to fabricate the lead frame conductors, such as but not limited to, a photochemical technique.

Figure 2:
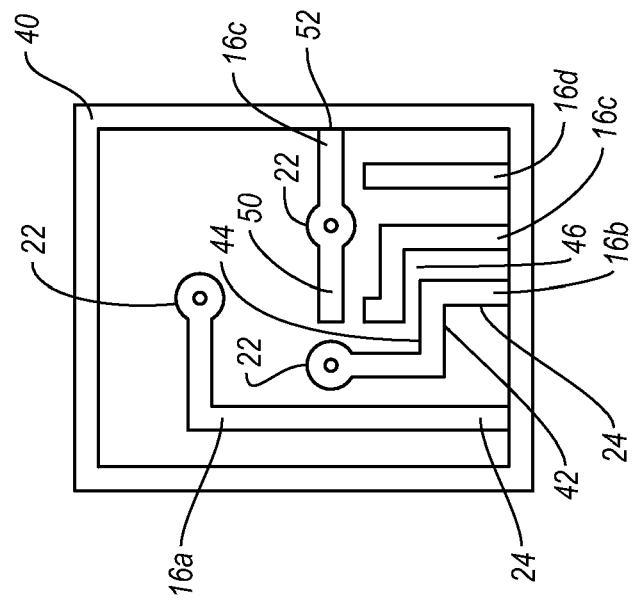
FIG. 2 illustrates a top view of the leads for the lead frame connector of FIG. 1 mounted in a support frame.

An exemplary configuration of a stamped structure is illustrated in FIG. 2 as being stamped from a portion of a ribbon 40 usable in a reel to reel fabrication process. Although only one structure is depicted in FIG. 2, it can be understood that one or more structures can be stamped on a reel or piece of conductive material. As shown in FIG. 2, each conductor 16a-16e connects to a portion of the ribbon 40. This ribbon 40 supports the conductors 16a-16e during injection molding, while positioning the conductors 16a-16e so that each contact will be electrically isolated one from another after singulation of the lead frame connector following molding of the casing 12 and the casing 14. The conductor configuration can be easily selected to conform to the conductor design that has been determined to have acceptable electrical performance as described above.

In this particular configuration, each conductor 16a-16e has a different configuration based upon the above identified simulation process and/or the attachment of the one or more passive components 30. As shown, the conductor 16a can include contact 22 at its first end and a contact 24 at its second end. Similarly, the conductor 16b can include contact 22 at its first end and contact 24 at its second end. As shown, the second conductor 16b has a stepped configuration between its first end and its second end. This configuration aids with positioning the contact 22 for mounting to an optical subassembly and the contact 24 for mounting to a printed circuit board. This configuration also increases amount of surface contact between the housing and the conductor 16b, thereby more securely retaining the conductor 16b within the casing 12 (FIG. 1) of the housing. Further, having the illustrated configuration prevents the conductor 16b from being easily withdrawn from the casing 12 (FIG. 1) because a portion of casing 12 (FIG. 1) will be disposed at transition points 42 and 44 following injection molding. The placement of the casing 12 (FIG. 1) and the stepped configuration of the conductor 16b locks the position of the conductor 16b relative to the casing 12 (FIG. 1) and prevent movement one relative to the other.

Similar to the conductor 16b, the conductor 16c can have a complementary configuration to that of the conductor 16b and includes a transition 46 and a transition 48. Unlike the conductor 16b, however, the conductor 16c does not include a contact at its first end, and only includes the contact 24 at its second end.

To facilitate electrical connection between the conductor 16b and a lead of an optical sub-assembly, included is the conductor 16e. This conductor 16e can include the contact 22, which can electrically contact a lead of an optical sub-assembly, and two extensions 50 and 52 that aid with electrically connecting the conductors 16c and 16d to the contact 22. More specifically, one or more passive components 30 (FIG. 1) can attach to each extension 50 and 52 and electrically connect the conductors 16c and 16d to the contact 22.

Figure 3:
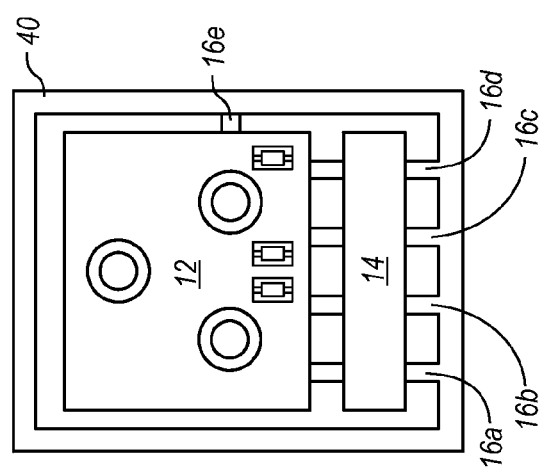
FIG. 3 illustrates a top view of lead frame connector of FIG. 1 mounted in a support frame.

Once stamped as depicted in FIG. 2, the ribbon of stamped conductors can be spooled from one reel to another as the insert injection molding process is performed to form the housing, i.e., the first casing 12 and the second casing 14. FIG. 3 illustrates a portion of the ribbon 40 with the first casing 12 and the second casing 14 formed about conductors 16a-16e. Reel to reel processing is a low cost process typically used for high volume applications. It will be understood that smaller volumes can be made in individual strips containing one or more lead frames that are then loaded into a molding machine. The choice of a particular manufacturing process can be driven by the optimum tradeoff between tooling cost, part cost, and volume without significantly changing the design of the part.

After the first casing 12 and the second casing are formed, the one or more passive components 30 (FIG. 1) can be mounted to the conductors 16a-16e. This can be achieved through soldering the passive components 30 (FIG. 1) directly through any soldering process known to those skilled in the art. Optionally, the mounted passive component 30 (FIG. 1) can be covered with an epoxy or other material to prevent inadvertent contact or damage to the passive components 30 (FIG. 1) and/or the conductors 16a-16e. In still another configuration, mounting of the passive components 30 to the conductors 16c-16e can also be performed while mounting the lead frame connector 10 to the TOSA 60 or prior or after mounting the leads 62 to the contacts 22.

Figure 4:
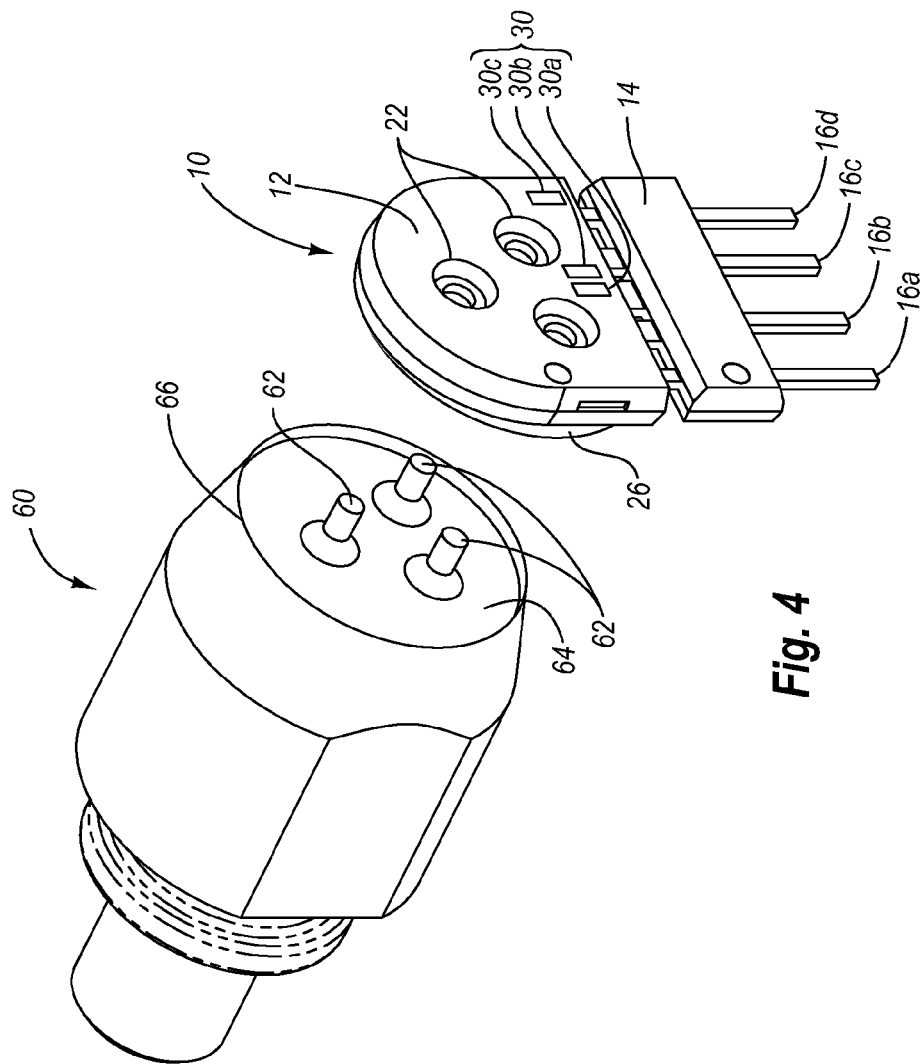
FIG. 4 illustrates a perspective view of the TOSA and the corresponding lead frame connector that can be constructed according to the exemplary embodiment of the present invention.

Once the passive components 30 (FIG. 1) are mounted, the combination of the lead frame conductor 10 mounted to the ribbon 40 can pass through a singulation die that dices the ribbon 40 into individual lead frame connectors 10, one of which is illustrated in FIG. 4. For instance, the dicing process can separate the conductors 16a-16e from the ribbon 40, optionally cutting the extension 52 flush with the first casing 12.

Once the conductors 16a-16e are cut, the lead frame connector 10 can be attached to an optical sub-assembly, such as TOSA 60. TOSA 60 has three leads 62 that extend from a base 64 at an end 66. As discussed before, lead frame connector 10 has three corresponding electrical contacts 22 that can receive the leads 62. The electrical contacts 22 can be aligned and then mounted to the leads 62 of the TOSA 60, such as by soldering or other attachment technique. Since the base 64 is recessed from the outer edge of the end 66, the first casing 12 includes a protrusion 26 that fits into the recess and aids with aligning the contacts 22 with the leads 62.

Figure 6:
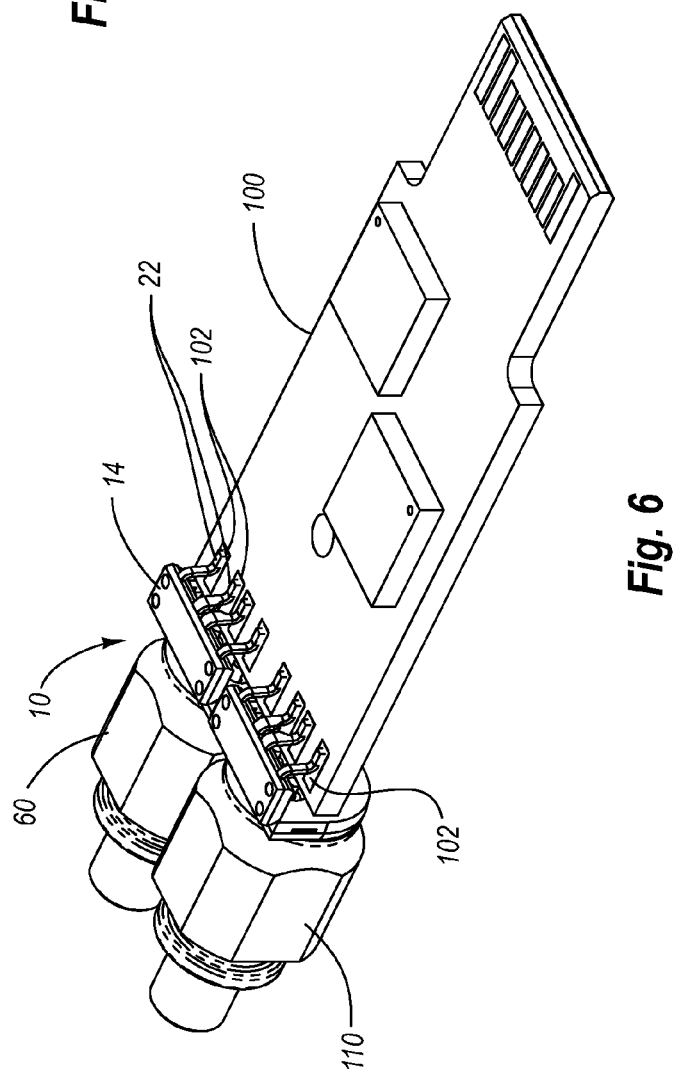
FIG. 6 is a perspective view of the opposite side of a printed circuit board of FIG. 5 that has the lead frame connectors of FIGS. 1-3 attached thereto.

The one or more passive components 30 limit and control signal reflection between the optical sub-assembly, such as the TOSA 60, and the printed circuit board, one being shown in FIG. 6. To reduce or eliminate signal reflection of signals propagating between different electrical or optoelectronic components, it is desirable for the impedances of the different components to match or be equal. For instance, the impedance presented by the TOSA 60 should match or equal the impedance presented by the lead frame connector 10 and the impedance presented by the lead frame connector 10 should match or equal the impedance presented by the printed circuit board 100 (FIG. 5) or the contact on the printed circuit board 100 (FIG. 1). When designing an optical module, such as a transceiver module, it is possible to design each component to achieve the desired impedance matching. Unfortunately, when using existing components in a manner that is different for which the component was originally designed, the new use can result in a change in the originally designed impedance. This impedance change can result in unmatched or unequal impedances and so signal reflection and losses. To match or equalize the impedances, the passive components 30 can be attached to one or more of the conductors 16.

In the illustrative configuration of the present invention, the TOSA 60 could have be designed for a 2 Gigabit environment and subsequently used in a 4 Gigabit environment. Since the impedance presented by the TOSA 60 is a function of the frequency of the propagating signal, operating the TOSA 60 at a higher frequency would result in unmatched or unequal lead frame connector and ROSA impedances. To match or equalize the impedances, the passive components 30 are connected to the connectors 16. As shown, the passive components 30 include the resistor 30a, the capacitor 30b, and the inductor 30c. For a situation when the TOSA 60 was designed for a 2 Gigabit environment, and has a 10 ohm resistance, and subsequently used in a 4 Gigabit environment, the resistor 30a can be about a 40 ohm resistor, the capacitor 30b can be a 0.1 pico-farad capacitor, and the inductor 30c can be a 0.1 micro Henries inductor. Various other values of resistance, capacitance, and inductance can be used dependent upon the particular resistance, capacitance, and inductance presented by the OSA and the conductors 16a-16e and the housing of the lead frame connector 10.

With the passive components 30 mounted on one or more of the conductors 16a-16e, the one or more passive components 30 may be secured in place, in addition to any solder, by covering the passive components with an epoxy or other material to protect the passive components. Various materials can be used to see the passive component within the first casing 12 of the housing.

With the passive components 30 mounted and the TOSA 60 and the lead frame connector 10 connected, the manufacturing process can include bending portions of the connectors 16a-16d to achieve the configuration illustrated in FIG. 5. The ends 20 of conductors 16 can then be bent to any desired angle to create the contacts 24 used to engage the pads on a printed circuit board. As shown in FIG. 5, in one exemplary embodiment, the ends 20 are given two 90° bends in opposite directions to form the contacts 24. Depending on the specific application, other angles are also possible. In alternate embodiments, the ends 20 can be bent prior to molding process and/or attachment to the TOSA 60.

In addition to bending the ends 20, the casing 14 orientated relative to casing 12 by bending the conductors 16 at a location intermediate of the casing 12 and the casing 14. By so doing, the casing 14 is orientated generally perpendicular to the casing 12. The degree of bending of the conductors 16 can vary based upon the position of the TOSA 60 and its associated printed circuit board with the transceiver module.

It can be understood that a similar process and device can be used for other optical sub-assemblies, including but not limited to a TOSA.

The exemplary embodiments of the methods and devices of the present invention has many of the advantages over prior systems. Since the casings can be coplanar during manufacture, it is much easier to manufacture the tooling needed to produce the injection molded part. Additionally, the punch out step can be eliminated, thus saving additional manufacturing costs. Finally, the lead frame connector 10 can be held at their ends, thus making it easier to grip the connectors during the manufacturing process. No external tabs, projections, or stubs are required, nor do such tabs, projections or stubs need to be removed as part of the assembly process. Additionally, the flattened configuration provides unobstructed access to the solder joints when attaching the lead frame to the OSA.

In addition to the above, another advantage of this exemplary embodiment is that the lead frame connector 10 can be manipulated into its operational configuration as part of the assembly process after the process used to dispose the conductors or leads within the casing, rather than during or as part of the process to dispose the conductors or leads within the casing.

Turning now to FIGS. 5 and 6, illustrated is an OSA, such as the TOSA 60 mounted to a printed circuit board 100. FIGS. 5 and 6 illustrate opposite sides of a printed circuit board 100 that has the lead frame connector 10 attached thereto. Exemplary embodiments of the invention disclosed herein also extend to methods of manufacturing or assembling optical transceiver modules using the lead frame connector 10. According to one embodiment, the method of manufacturing a transceiver module includes a step of connecting the lead frame connectors 10 of the corresponding optical sub-assemblies 60. As the process can be substantially the same for the ROSA and the TOSA, the processing of only TOSA 60 is described in detail below.

As discussed above, the lead frame connector 10 can be aligned with the leads 62 that protrude from the back end of the TOSA 60. The leads 62 can pass through corresponding holes associated with the contacts 22 of the lead frame connector 10 and leads 62 can be soldered to the conductors 16 of lead frame connector 10. Mounting the leads 62 to the contacts 22, such as by passing the leads 62 through the holes in the contacts 22, can result in substantial self-alignment of lead frame connector 10 with the TOSA 60. Once the soldering has been performed, the combined TOSA 60 and lead frame connector 10 becomes a surface mount device that can then be mounted to the printed circuit board 100.

The process of surface mounting the combined TOSA 60 and the lead frame connector 10 to printed circuit board 100 can be performed in any of a variety of ways. As shown in FIG. 6, the lead frame connector 10 can have an array of connectors 16 that are bent in a way that allows them to contact a corresponding array of pads 102 on printed circuit board 100. As the conductors 16 of the lead frame connector 10 are placed in contact with pads 102, the physical connection can be made by hand soldering, by reflow of a solder paste formed on the printed circuit board 100, by a hot bar process, or by any other suitable technique. Another option can be to use a fixture that facilitates the process of placing the lead frame connector 10 in contact with printed circuit board 100 and soldering it thereto.

It is noted that, according to certain embodiments of the invention, the process of connecting the combined TOSA 60 and the lead frame connector 10 to printed circuit board 100 does not require epoxy reinforcement and avoids alignment handling issues that have been experienced in conventional methods of connecting optical sub-assemblies to PCBs using, for instance, flex circuits.

The present invention may be embodied in other specific forms without departing from its spirit or essential characteristics. The described embodiments are to be considered in all respects only as illustrative and not restrictive.

We claim:

1. A lead frame connector for connecting an optical sub-assembly to a printed circuit board, the lead frame connector comprising:
    an electrically insulating housing having a first part and a second part;
    a plurality of conductors electrically isolated one from another by the electrically insulating housing, each conductor of the plurality of conductors having a first end disposed in the first part with a hole to receive a portion of the optical sub-assembly and a second end extending from the second part; and
    at least one passive component mounted to one or more of the plurality of conductors, the at least one passive component comprising at least one of a resistor, a capacitor, and an inductor.

2. A lead frame connector as defined in claim 1, wherein the electrically insulating housing comprises polymer.

3. A lead frame connector as defined in claim 1, further comprising at least one connector conductor, the at least one connector conductor having a hole that receives a lead of the optical sub-assembly.

4. A lead frame connector as defined in claim 3, wherein at least one of the plurality of conductors have a stepped configuration between the first end and the second end.

5. A lead frame connector as defined in claim 3, wherein at least one of the plurality of conductors is bent during assembly of the optoelectronic device.

6. A lead frame connector as defined in claim 5, wherein one or more of the conductors of the plurality of conductors has a first end and a second end, the second end being formed to contact an electrical contact of the printed circuit board.

7. A lead frame connector as defined in claim 5, wherein the lead frame is connected to the printed circuit board with a leadless lead solder.

* * * * *